United States Patent [19]
Shakkarwar

[11] Patent Number: 6,154,419
[45] Date of Patent: Nov. 28, 2000

[54] METHOD AND APPARATUS FOR PROVIDING COMPATIBILITY WITH SYNCHRONOUS DYNAMIC RANDOM ACCESS MEMORY (SDRAM) AND DOUBLE DATA RATE (DDR) MEMORY

[75] Inventor: Rajesh G. Shakkarwar, Cupertino, Calif.

[73] Assignee: ATI Technologies, Inc., Thornhill, Canada

[21] Appl. No.: 09/524,433

[22] Filed: Mar. 13, 2000

[51] Int. Cl.[7] .................................................. G11C 13/04
[52] U.S. Cl. ...................................... 365/235; 365/230.03
[58] Field of Search ............................. 365/235, 230.03, 365/238.5

[56] References Cited

U.S. PATENT DOCUMENTS 6,044,032  3/2000  Li ....................................... 365/230.03
6,060,916  5/2000  Park ........................................... 327/99

*Primary Examiner*—Vu A. Le
*Attorney, Agent, or Firm*—Markison & Reckamp, P.C.

[57] ABSTRACT

A method and apparatus for providing compatibility with synchronous dynamic random access memory (SDRAM) and double data rate (DDR) memory is provided. While memory accessing agents, such a microprocessors, typically have a fixed memory access size (e.g., number of bits or bytes exchanged with a memory device in a single operation), DDR memory provides twice the memory burst capability of SDRAM. A method and apparatus is provided to allow memory access agents to exchange data with both SDRAM and DDR memory. Smaller groups of data may be combined or larger groups of data may be separated to allow compatibility. Buffering is provided to accommodate proper timing. Both SDRAM and DDR memory may be used simultaneously.

34 Claims, 8 Drawing Sheets

METHOD AND APPARATUS FOR PROVIDING COMPATIBILITY WITH SYNCHRONOUS DYNAMIC RANDOM ACCESS MEMORY (SDRAM) AND DOUBLE DATA RATE (DDR) MEMORY

TECHNICAL FIELD OF THE INVENTION

The invention relates generally to dynamic random access memory devices (DRAMs) and more specifically to a method and apparatus for effecting communication of data with DRAMs.

BACKGROUND OF THE INVENTION

Digital information is often stored in dynamic random access memory devices (DRAMs). One type of DRAM transfers information synchronously with a clock signal. This type of DRAM is referred to as synchronous DRAM (SDRAM). SDRAMs provide a burst of four data transfers on every burst read access (when programmed for burst length of 4). In case of 64-bit data bus interface system, such a transfer involves 32 bytes of data per SDRAM access. Current PC systems typically use such an arrangement. The L1 and L2 caches of some of the current x86 CPUs are designed to expect 32 bytes of data per main memory access, which matches the data being delivered by the SDRAM. SDRAM devices transfer information once every clock cycle of the clock signal.

Double Data Rate (DDR) memory devices differ from SDRAM devices in that they transfer data on each edge of the clock signal (i.e., twice every clock cycle of the clock signal), thus doubling the peak throughput of the memory device as compared with SDRAM. DDR memory devices thus provide a burst of eight data transfers on every burst read access (when programmed for burst length of 4).

Unfortunately, memory accessing agents that exchange information with memory devices are designed to transfer the information according to a fixed memory access size. For example, microprocessors include L1 and L2 caches that are designed specifically for 32-byte transfer suitable for SDRAM technology or specifically for 64-byte transfer suitable for DDR memory technology. It has been impractical to design microprocessors to support different cache line sizes to support both SDRAM and DDR memory technologies. Additionally, other memory accessing system agents, for example, a peripheral component interconnect (PCI) interface master device, an accelerated graphics port (AGP) graphics master device, etc., could have different cache size requirements.

However, being able to support both SDRAM and DDR memory technologies with a single computer system design would allow systems to be offered at different price points, which would be very desirable. Also, support for both memory technologies would avoid obstacles to upgrading memory within a computer system. Thus, a technique is needed to provide compatibility for both SDRAM and DDR memory devices within a common system.

DETAILED DESCRIPTION OF A PREFERRED EMBODIMENT

Figure 1:
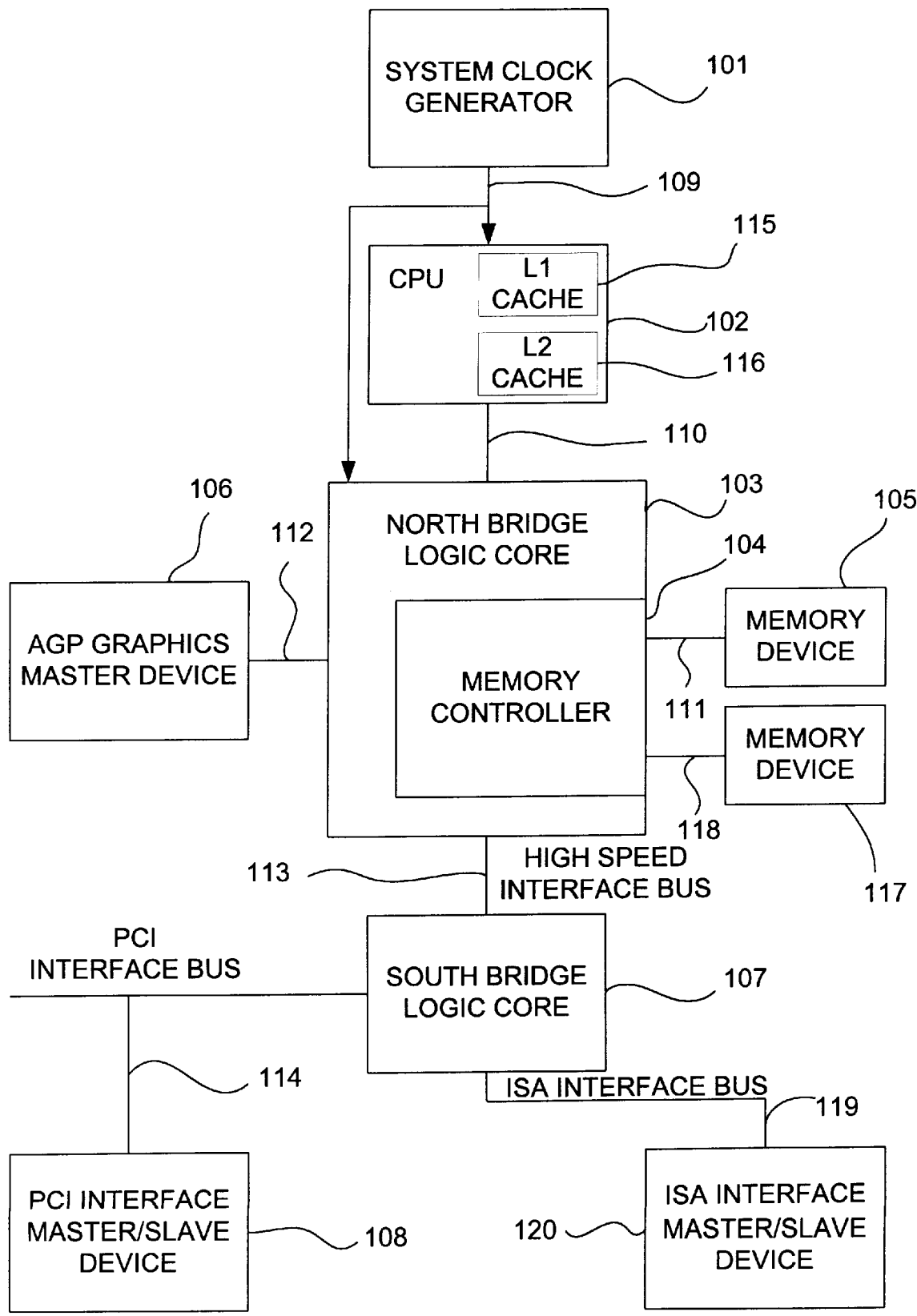
FIG. 1 is a block diagram illustrating an embodiment of the present invention.

A method and apparatus for providing compatibility with synchronous dynamic random access memory (SDRAM) and double data rate (DDR) memory is provided. While memory accessing agents, such a microprocessors, typically have a fixed memory access size (e.g., number of bits or bytes exchanged with a memory device in a single operation), DDR memory provides twice the memory burst capability of SDRAM. A method and apparatus is provided to allow memory access agents to exchange data with both SDRAM and DDR memory. Smaller groups of data may be combined or larger groups of data may be separated to allow compatibility. Buffering is provided to accommodate proper timing. Both SDRAM and DDR memory may be used simultaneously.

An embodiment of the invention provides compatibility with microprocessors having L1 and L2 cache line size of different sizes, for example, 32 bytes and 64 bytes. For a microprocessor with a 32-byte cache line size, communication with an SDRAM is provided by transferring 32 bytes at a time. However, with DDR memory, when a central processing unit (CPU), for example, a microprocessor, requests a data access, a memory controller executes a burst read access from the DDR memory. The DDR memory provides 64 bytes (8 bursts of 8 bytes each) of data to the memory controller. The memory controller stores this data in a line buffer and provides the appropriate half of the line buffer to the CPU, e.g., the lower 32 bytes for a lower address access and the upper 32 bytes for a higher address access. The line buffer thus hides the DDR memory burst capability incompatibility from the CPU L1 and L2 cache architecture.

For a microprocessor with a 64-byte cache line size in conjunction with a SDRAM device, when the CPU requests a data access, a memory controller generates a first access to obtain a first 32-bytes of the 64-byte cache line size. After the first access, the memory controller generates a dummy access to the ((CPU address A31/A35 to A5)+32 bytes) location. The memory controller concatenates the first access and dummy access to provide 64-byte data to the CPU. The memory controller, by using the dummy access, thus hides the SDRAM memory burst capability incompatibility from the CPU L1 and L2 architecture. For a microprocessor with a 64-byte cache line size in conjunction with DDR, when the CPU requests a data access, the memory controller obtains the entire 64 bytes of data from the DDR memory device and provides them to the CPU, thereby accommodating the 64-byte cache line size.

FIG. 1 is a block diagram illustrating an embodiment of the present invention. System clock generator 101 is coupled to and provides a clock signal 109 to central processing unit 102 and to north bridge logic core 103. Central processing unit 102 includes L1 cache 115 and/or L2 cache 116. CPU 102 is coupled via bus 110 to north bridge logic core 103.

North bridge logic core 103 includes memory controller 104 which is coupled to memory device 105 to read and write data 111. North bridge logic core 103 is also coupled to memory device 117 to read and write data 118. Memory device 105 and memory device 117 may both be SDRAM or DDR memory, or one may be SDRAM while the other is DDR memory. Additional memory devices may also be coupled to memory controller 104. These additional memory devices may be SDRAM, DDR memory, or a combination thereof.

North bridge logic core 103 is coupled to AGP graphics master device 106 and passes video information 112 to AGP graphics master device 106. North bridge logic core 103 is coupled to south bridge logic core 107 via high speed interface bus 113. South bridge logic core 107 is coupled to PCI interface master/slave device 108 (e.g., PCI interface master device and/or PCI interface slave device) via PCI interface bus 114. South bridge logic core 107 is coupled to ISA interface master/slave device 120 (e.g., ISA interface master device and/or ISA interface slave device) via ISA interface bus 119.

The elements of FIG. 1 may be thought of as memory accessing agents, a memory device, and a memory controller. The memory device is memory device 105, and the memory controller is memory controller 104. The memory accessing agents include CPU 102, accelerated graphics master device 106, south bridge logic core 107, PCI interface master device 108, and ISA interface master device 120. Any other system components that access, interact with, use data from, or supply data to a memory device may be considered to be memory accessing agents.

Figure 2:
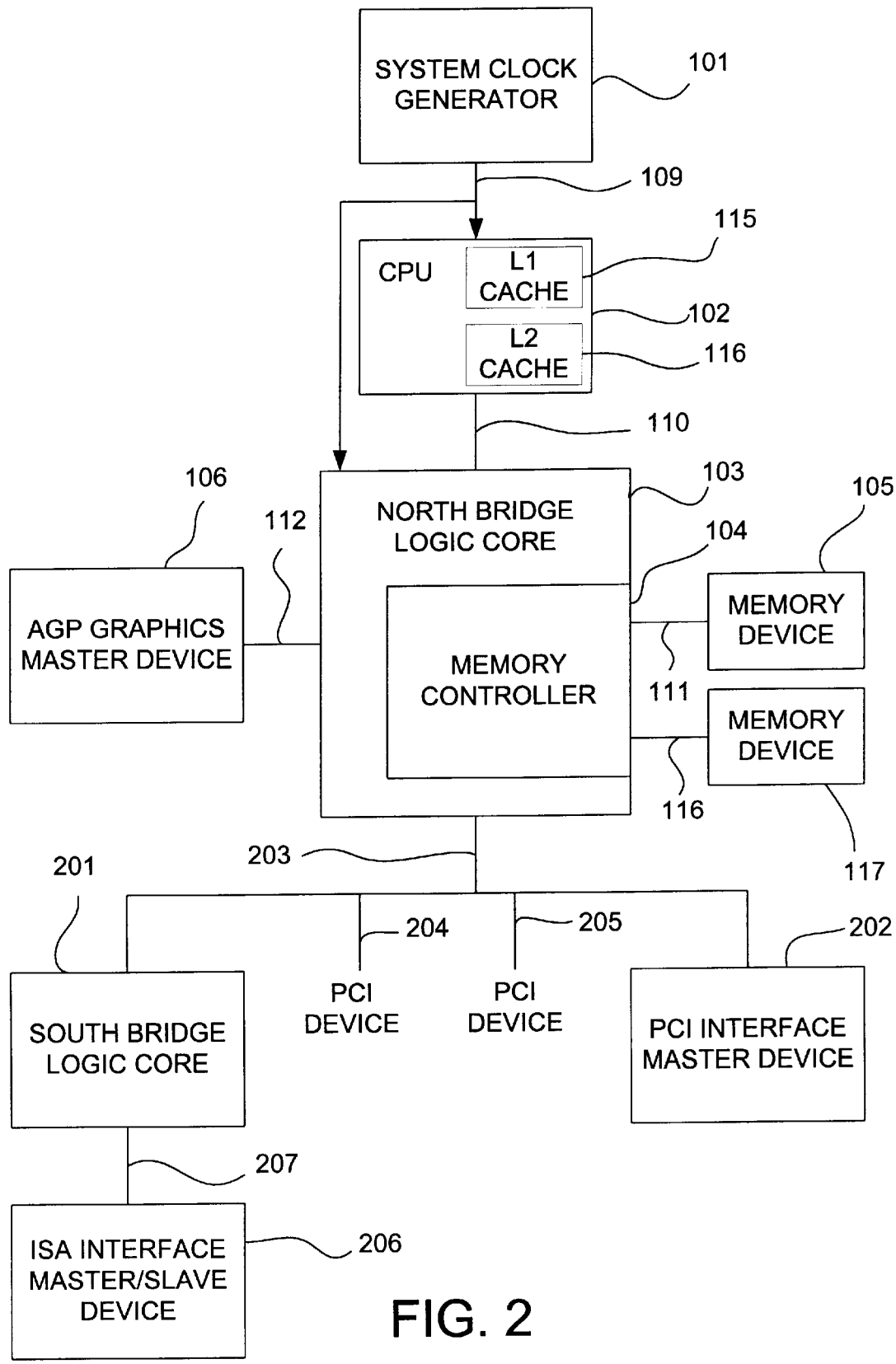
FIG. 2 is a block diagram illustrating a system in accordance with an embodiment of the present invention.

FIG. 2 is a block diagram illustrating a system in accordance with an embodiment of the present invention. The system includes system clock generator 101, CPU 102, north bridge logic core 103, memory controller 104, memory device 105, memory device 117, and AGP graphics master device 106, configured as illustrated in FIG. 1. North bridge logic core 103 is coupled to south bridge logic core 201, PCI interface master device 202, and PCI devices 204 and 205 via peripheral bus 203, which may, for example, be a PCI interface bus. South bridge logic core 201 is coupled to ISA interface master/slave device 206 (e.g., an ISA interface master device and/or an ISA interface slave device) via bus 207.

Figure 3:
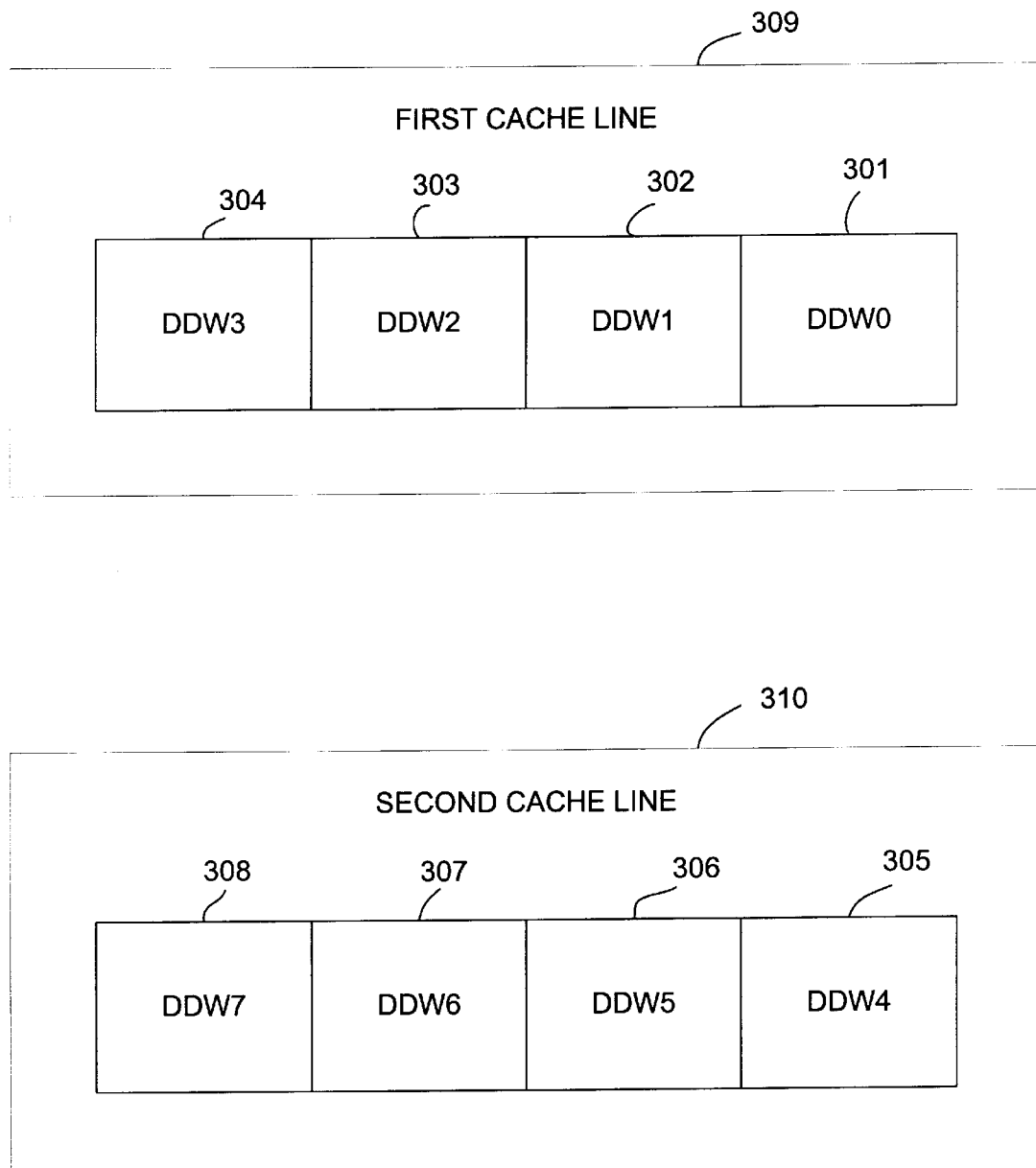
FIG. 3 is a block diagram illustrating a first cache line 309 and a second cache line 310 in accordance with the present invention.

FIG. 3 is a block diagram illustrating a first cache line 309 and a second cache line 310 in accordance with the present invention. The first cache line 309 includes four 64-bit so-called "double double" words, including DDW0 301, DDW1 302, DDW2 303, and DDW3 304. The second cache line 310 includes four 64-bit "double double" words, including DDW4 305, DDW5 306, DDW6 307, and DDW7 308.

Figure 4:
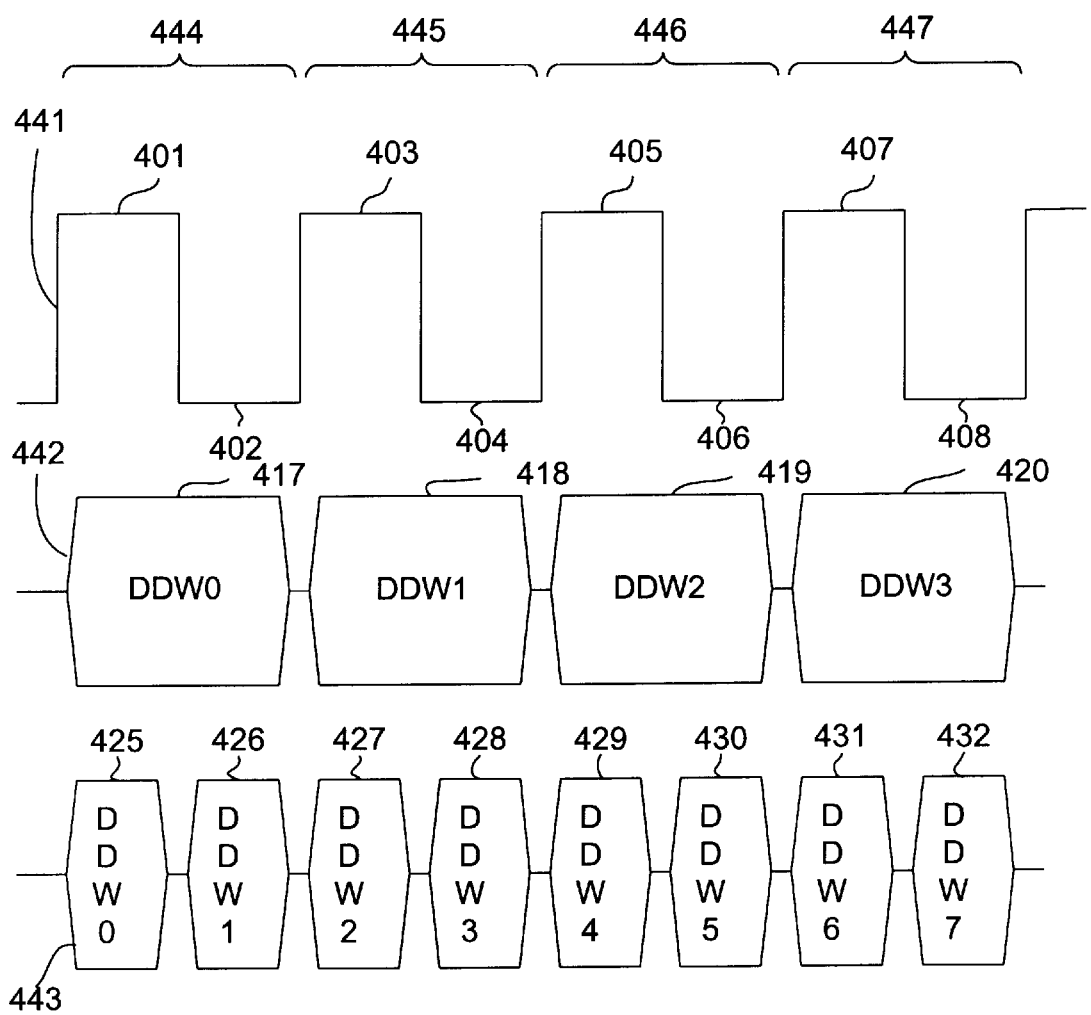
FIG. 4 is a timing diagram illustrating timing of SDRAM memory data 442 and DDR memory data 443 relative to a clock signal 441.

FIG. 4 is a timing diagram illustrating timing of SDRAM memory data 442 and DDR memory data 443 relative to a clock signal 441. Clock signal 441 includes a first cycle 444 having a first half 401 and a second half 402. Clock signal 441 includes a second cycle 445, including a first half 403 and a second half 404. Clock signal 441 includes a third cycle 446 including a first half 405 and a second half 406. Clock signal 441 includes a fourth cycle 447 including a first half 407 and a second half 408.

SDRAM memory data 442 includes a plurality of 64-bit double double words, including double double words DDW0 417, DDW1 418, DDW2 419, and DDW3 420. Double double word DDW0 417 is communicated during cycle 444. Double double word DDW1 418 is communicated during cycle 445. Double double word DDW2 419 is communicated during cycle 446. Double double word DDW3 420 is communicated during cycle 447.

DDR memory data 443 includes a plurality of double double words, including double double words DDW0 425, DDW1 426, DDW2 427, DDW3 428, DDW4 429, DDW5 430, DDW6 431, DDW7 432. Double double word DDW0 425 is communicated during a first half 401 of cycle 444. Double double word DDW1 426 is communicated during a second half 402 of cycle 444. Double double word DDW2 427 is communicated during a first half 403 of cycle 445. Double double word DDW3 428 is communicated during a second half 404 of cycle 445. Double double word DDW4 429 is communicated during a first half 405 of cycle 446. Double double word DDW5 430 is communicated during a second half 406 of cycle 446. Double double word DDW6 431 is communicated during a first half 407 of cycle 447. Double double word DDW7 432 is communicated during a second half 408 of cycle 447.

Figure 5:
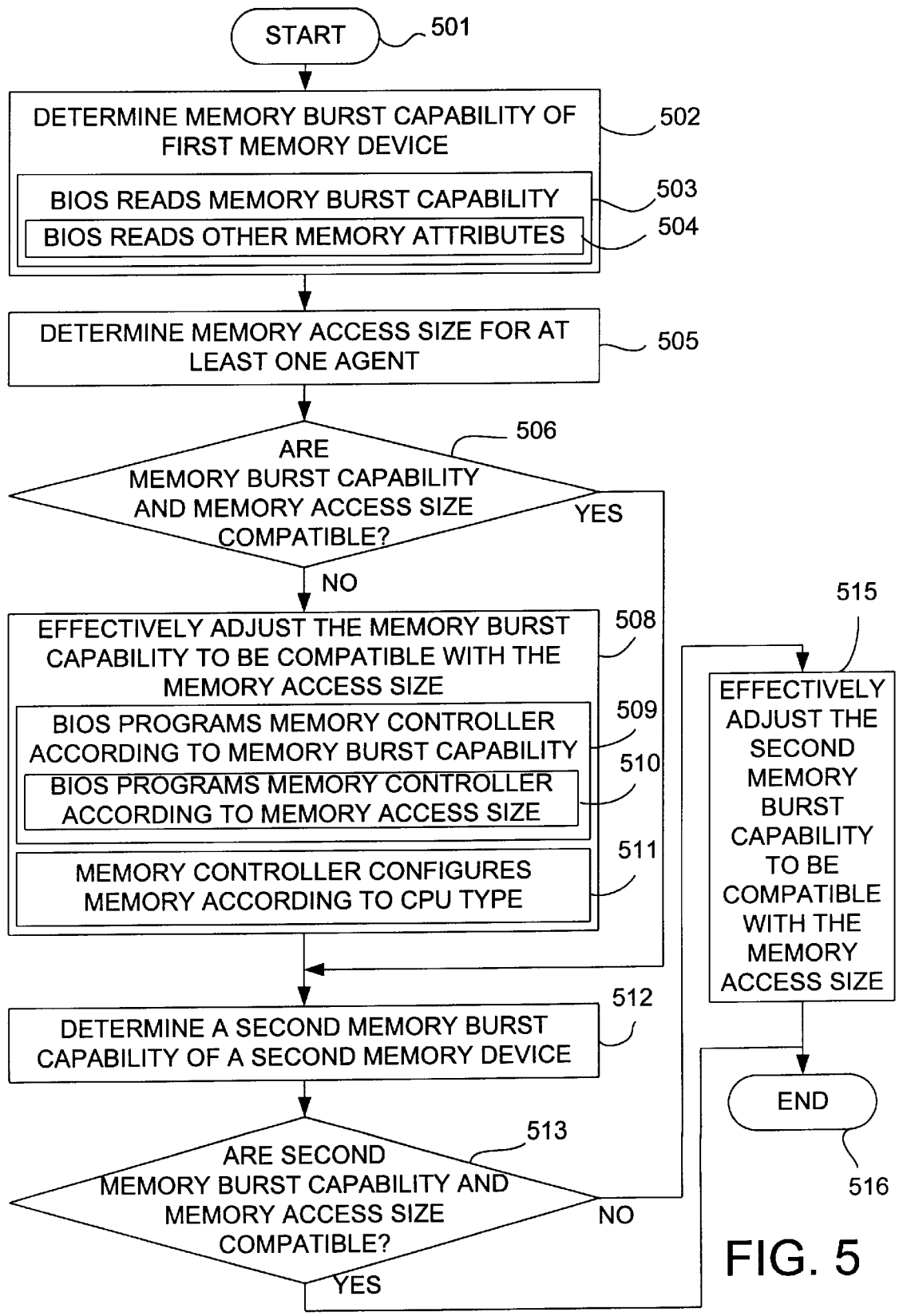
FIG. 5 is a flow diagram illustrating a method in accordance with an embodiment of the present invention.

FIG. 5 is a flow diagram illustrating a method in accordance with an embodiment of the present invention. The method begins in step 501 and continues to step 502. In step 502, a memory burst capability of a first memory device is determined. Step 502 may include step 503. In step 503, a basic input/output system (BIOS) utilizes a firmware program to read the memory burst capability. Step 503 may include step 504. In step 504, the BIOS also reads other memory attributes. These other memory attributes may include the memory speed, etc.

From step 502, the process continues to step 505. In step 505, a memory access size for at least one agent is determined. The process may be repeated for additional agents. Alternatively, multiple agents may be accommodated during one pass through the process. In step 506, a determination is made as to whether or not the memory burst capability and the memory access size are compatible. This compatibility may be determined by comparing the number of bits of the memory burst capability to the number of bits of the memory access size to determine if they have an identical number of bits. If the memory burst capability and the memory access size are not compatible, the process continues to step 508. In step 508, a memory controller effectively adjusts the memory burst capability to be compatible with the memory access size. Step 508 may include step 509 and step 511. In step 509, the BIOS programs the memory controller according to the memory burst capability. Step 509 may include step 510. In step 510 the BIOS programs the memory controller according to the memory access size. From step 509, the process continues to step 511. In step 511, the memory controller configures a memory device according to the CPU type. For example, the memory controller may configure the memory device to provide data in a certain burst order to the CPU.

From step 508, the process continues to step 512. The process also continues to step 512 in the event that the memory burst capability and the memory access size are found to be compatible in step 506. In step 512, a second memory burst capability of a second memory device is determined. In step 513, a determination is made as to whether the second memory burst capability and the memory access size are compatible. If the second memory burst capability and the memory access size are not compatible, the process continues to step 515. In step 515, the memory controller effectively adjusts the second memory burst capability to be compatible with the merry access size. From step 515, the process ends in step 516. The process also ends in step 516 if, in step 513, the second memory burst capability and the memory access size are found to be compatible.

The process may be used to provide compatibility of one or more agents with an arbitrarily large number of memory devices having varying memory burst capabilities, including an arbitrarily large number of variations of memory burst capability. Likewise, the process may be used to accommodate an arbitrarily large number of variations of memory access size.

Figure 6:
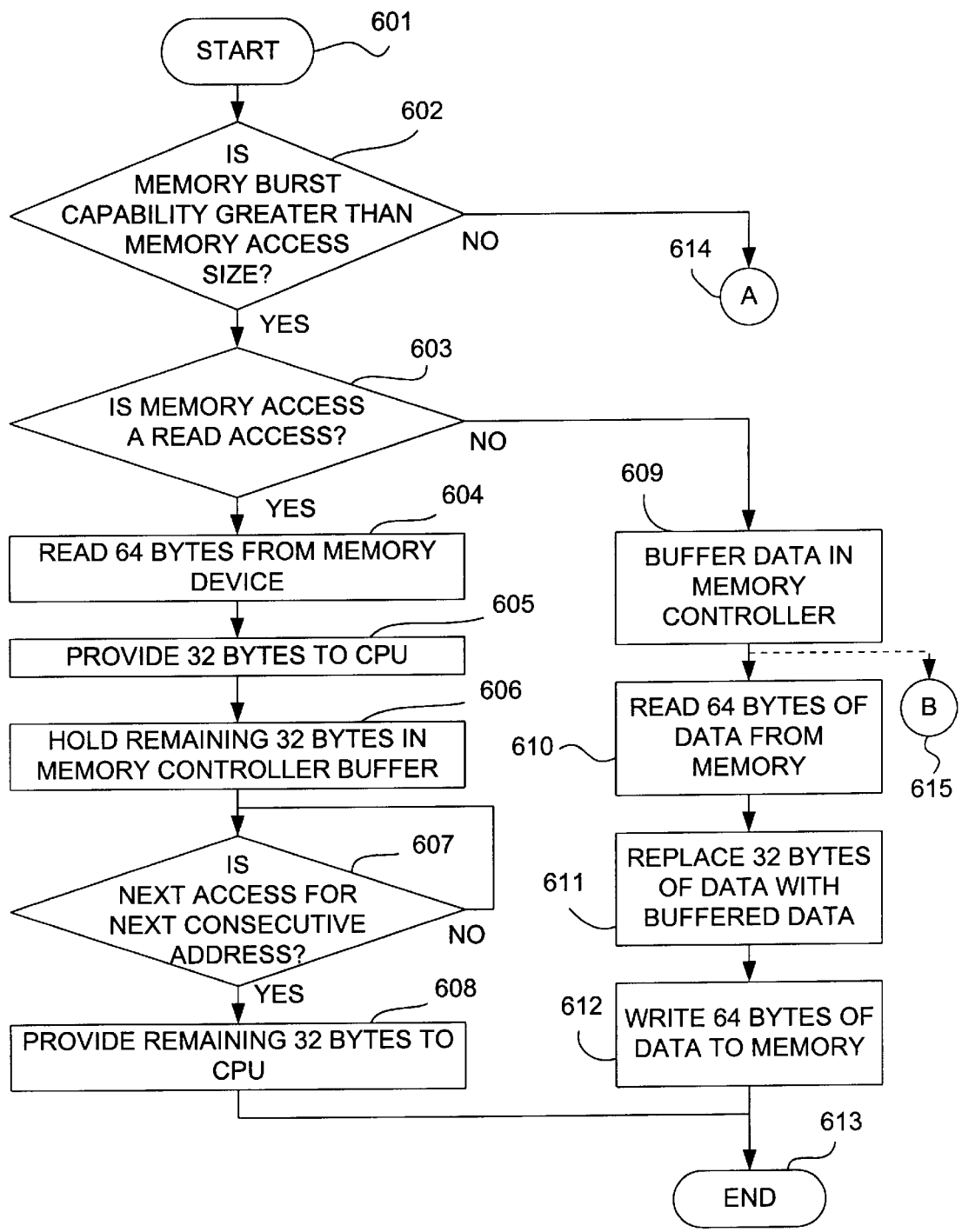
FIG. 6 is a flow diagram illustrating one embodiment of step 508 in accordance with the present invention.

FIG. 6 is a flow diagram illustrating one embodiment of step 508 in accordance with the present invention. The method begins in step 601 and continues to step 602. In step 602, a determination is made as to whether the memory burst capability is greater than the memory access size. If the memory burst capability is not greater than the memory access size, the process continues to step 802 of FIG. 8 via reference 614. If, however, the memory burst capability is greater than the memory access size, the process continues to 603.

In step 603, a determination is made as to whether the memory access is a read access. If the memory access is a read access, the process continues to step 604. In step 604, the memory controller reads 64 bytes from memory device 105. In step 605, the memory controller 104 provides only 32 of the 64 bytes into one cache line of the CPU cache, for example, L1 cache 115 or L2 116. In step 606, the memory controller 104 holds the remaining 32 bytes read from memory device 105 in a memory controller buffer. In step 607, a determination is made as to whether the next memory access is for the next consecutive address. If the next memory access is for the next consecutive address, the memory controller, in step 608, provides the remaining 32 bytes of the 64 bytes read from memory device 105 into an appropriate cache line of CPU 102, for example, in L1 cache 115 or L2 cache 116.

If in step 603, a determination was made that the memory access is not a read access, for example, the memory access is a write access, the process continues to step 609. In steps 609, the memory controller buffers the data from the central processing unit 102 to free the CPU 102 for other tasks. From step 609, the process continues to either step 610 of FIG. 6 or step 702 of FIG. 7 (via reference 615). Alternatively, the process may include both steps 610 and 702 and the steps that follow them. In step 610, the memory controller reads data from memory device 105 at the location at which the data being buffered by the memory controller 104 is intended to be stored. The memory controller 104 reads, for example, 64 bytes of data from memory device 105. In step 611, the memory controller 104 replaces 32 bytes of the data read from memory device 105 with the data buffered in the memory controller. In step 612, the memory controller writes the 64 bytes of data, including the 32 bytes of data buffered in the memory controller 104 from CPU 102 and the 32 bytes of data read from memory device 105, to memory device 105. As an alternative to continuing at step 610, the process can continue from step 609 to step 702 via reference 615.

Figure 7:
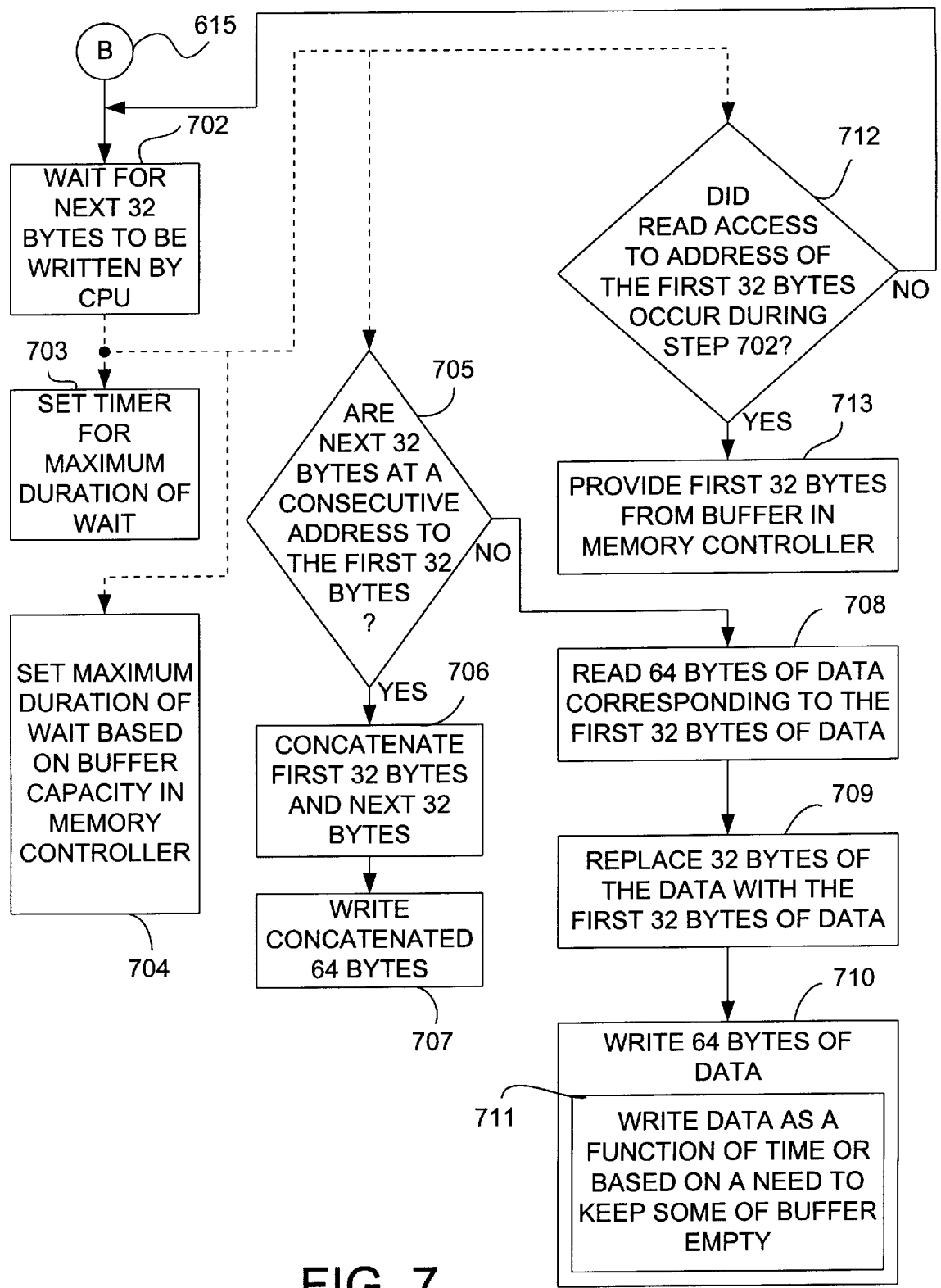
FIG. 7 is a flow diagram illustrating a portion of a process in accordance with the present invention.

FIG. 7 is a flow diagram illustrating a portion of a process in accordance with the present invention. This portion of the process begins at reference 615 and continues to step 702. In step 702, the process waits for the next 32 bytes consecutive with the 32 bytes being buffered by memory controller 104 to be written from CPU 102. The next 32 bytes need not immediately follow the first 32 bytes, but can be written by the CPU 102 (i.e., transferred to the memory controller 104) at any time while the first 32 bytes are still in the buffer of memory controller 104.

From step 702, the process may proceed to any of steps 703, 704, 705, or 712. If the process proceeds to step 703, the memory controller 104 sets a timer for the maximum duration of the wait in step 703. If the process continues to step 704, the memory controller 104 sets a maximum duration of wait based on the buffer capacity in the memory controller 104. Step 704 may be performed in conjunction with step 703. If the process continues from step 702 to step 705, a determination is made as to whether the next 32 bytes are at a consecutive address to the first 32 bytes. If the next 32 bytes are at a consecutive address to the first 32 bytes, the process continues in step 706. In step 706, the memory controller 104 concatenates the first 32 bytes with the next 32 bytes. In step 707, the memory controller 104 writes the concatenated 64 bytes to memory device 105.

If, in step 705, it is determined that the next 32 bytes are not for a consecutive address to the first 32 bytes, the process continues to step 708. In step 708, the memory controller 104 reads 64 bytes of data corresponding to the first 32 bytes of data from memory device 105. In step 709, the memory controller 104 replaces half of the 64 bytes of data read from memory device 105 with the 32 bytes of data received from CPU 102. In step 710, the memory controller 104 writes to memory device 105 the 64 bytes of data, including the 32 bytes of data received from CPU 102 and the remaining 32 bytes of data read from memory device 105 that have not been replaced by the 32 bytes of data received from CPU 102. Step 710 may include step 711. In step 711, the writing of the data by memory controller 104 to memory device 105 is performed either as a function of time or based on the need to keep some of the buffer of memory controller 104 empty to allow additional memory writes from CPU 102.

If the process continues from step 702 to step 712, a determination is made at step 712 whether the read access to address the first 32 bytes of data occurs during the wait occurring in step 702. If not, the process returns to step 702. If so, the process continues to step 713. In step 713, the first 32 bytes are provided from the buffer in memory controller 104.

Figure 8:
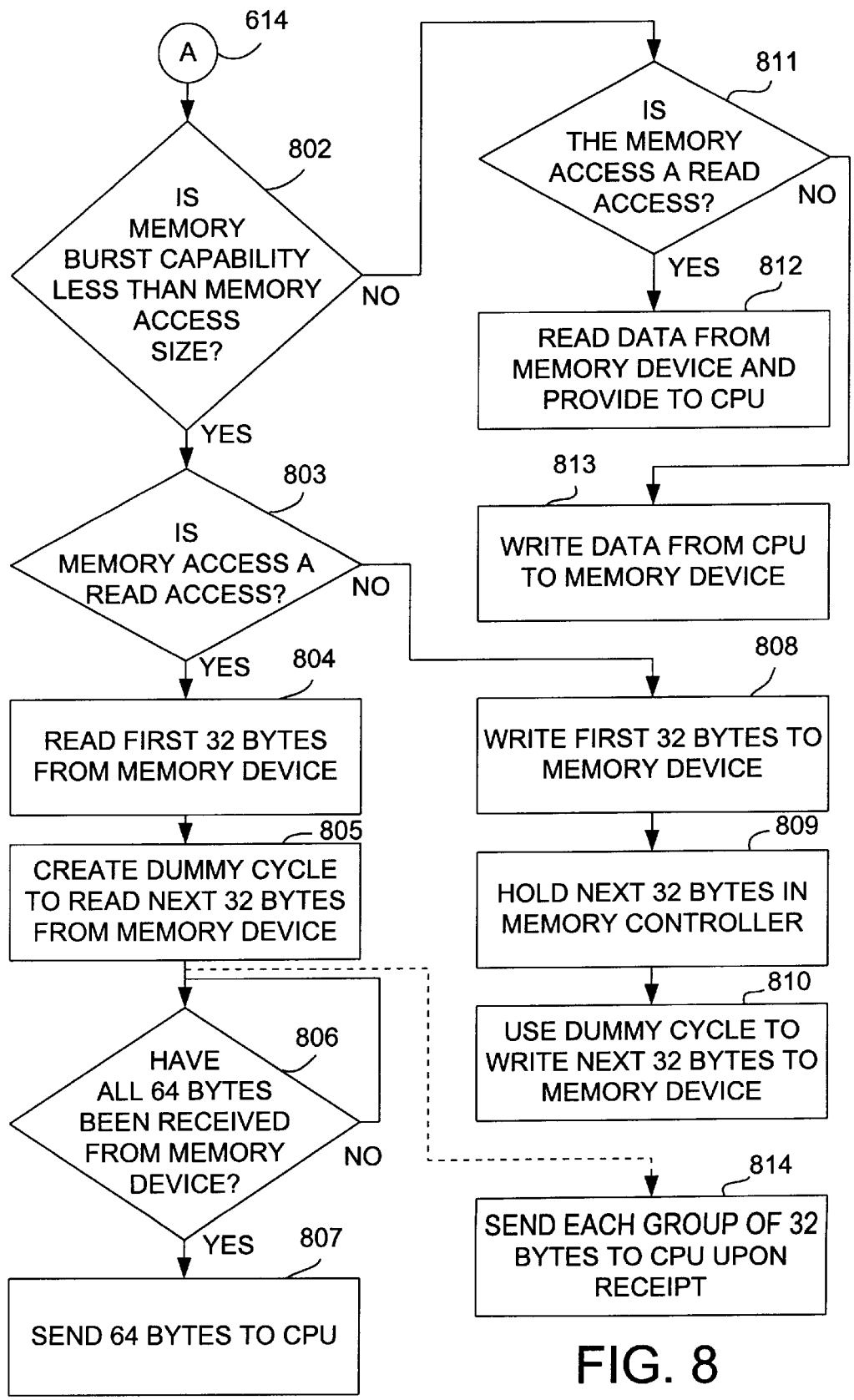
FIG. 8 is a flow diagram illustrating a portion of a process in accordance with the present invention.

FIG. 8 is a flow diagram illustrating a portion of a process in accordance with the present invention. In step 602 of FIG. 6, a determination was made as to whether or not the memory burst capability is greater than the memory access size. If it was determined that the memory burst capability is not greater than the memory access size, the process continues to step 802 via reference 614. In step 802, a determination is made as to whether or not the memory burst capability is less than the memory access size. If it is determined that the memory burst capability is less than the memory access size, the process continues to step 803. In step 803, a determination is made as to whether or not the memory access is a read access. If the memory access is a read access, the process continues to step 804. In step 804, the memory controller 104 reads a first 32 bytes of data from memory device 105. In step 805, the memory controller 104 creates a dummy cycle to read the next 32 bytes from memory device 105.

From step 805, the process continues to either step 806 or step 814. If the process continues to step 806, a determination is made as to whether all 64 bytes have been received by the memory controller 104 from memory device 105. If not, the process returns to step 806 and continues to wait. If, in step 806, all 64 bytes have been received by the memory controller 104 from the memory device 105, the process continues to step 807. In step 807, the memory controller sends all 64 bytes to CPU 102. If, from step 805, the process proceeds to step 814, the memory controller 104 provides the first 32 bytes received from memory device 105 to CPU 102 upon receiving them and, upon receiving the next 32 bytes, sends them to CPU 102. If the processor is able to accommodate data being provided 32 bytes at a time, it is advantageous to send the first 32 bytes upon receipt and follow with the next 32 bytes upon receipt to avoid the delay of waiting until all 64 bytes have been received by memory controller 104.

If in step 803, a determination is made that the memory access is not a read access, for example, the memory access is a write access, the process continues to step 808. In step 808, the memory controller writes the first 32 bytes to memory device 105. In step 809, the memory controller 104 holds the next 32 bytes in a buffer of the memory controller 104. In step 810, the memory controller 104 uses a dummy cycle to write the next 32 bytes to memory device 105.

If, in step 802, the determination was made that the memory burst capability is not less than the memory access size (i.e., the memory burst capability and the memory access size are identical and, therefore, compatible) the process continues from step 802 to step 811. In step 811, a determination is made as to whether or not the access is a read access. If the memory access is a read access, the process continues in step 812. In step 812, the data is read from memory device 105 and provided to CPU 102 without having to delay the data or generate dummy cycles to read all of the data. If, in step 811, it is determined that the memory access is not a read access, for example, the memory access is a write access, the process continues to step 813. In step 813, the memory controller 104 receives the data from CPU 102 and writes it to memory device 105 without the need to delay the data or generate dummy cycles.

Where reference is made to memory device 105 with regard to the above process, the process may be applied to other memory devices, for example, memory device 117. The determination of the memory device to which the process is to be applied may be made in accordance to a desired memory address.

Accordingly, a method and apparatus for providing compatibility with synchronous dynamic random access memory (SDRAM) and double data rate (DDR) memory has been described. It should be understood that the implementation of other variations and modifications of the invention in its various aspects will be apparent to those of ordinary skill in the art, and that the invention is not limited by the specific embodiments described. While the above processes are described with respect to 32-byte and 64-byte groups of data, it should understood that the invention may be practiced with groups of data of any desired size. It is therefore contemplated to cover by the present invention, any and all modifications, variations, or equivalents that fall within the spirit and scope of the basic underlying principles disclosed and claimed herein.

What is claimed is:

1. A method for controlling a memory access to a first memory device comprising the steps of:
   determining a memory burst capability of the first memory device;
   determining a memory access size for at least one agent;
   determining whether the memory burst capability and the memory access size are compatible;
   when the memory burst capability and the memory access size are not compatible, effectively adjusting within a memory controller the memory burst capability to be compatible with the memory access size.

2. The method of claim 1 further comprising the step of:
   when the memory burst capability is greater than the memory access size and when the memory access is a read access,
   reading data in accordance with the memory burst capability;
   providing a first portion of the data in accordance with the memory access size to the agent;
   holding a second portion of the data in accordance with the memory access size;
   when next access is for next consecutive address, providing the second portion of the data to the agent.

3. The method of claim 1 further comprising:
   when the memory burst capability is greater than the memory access size and when the memory access is write access,
   buffering agent data from the agent;
   reading memory data from the first memory device;
   replace a portion of the memory data with the agent data; and
   writing the memory data including the agent data to the first memory device.

4. The method of claim 1 further comprising:
   when the memory burst capability is greater than the memory access size and when the memory access is write access,
   buffering a first portion of agent data from the agent; and
   waiting for a next portion of agent data from the agent.

5. The method of claim 4 further comprising the step of:
   setting a timer for a maximum duration of waiting.

6. The method of claim 4 further comprising the step of:
   setting a maximum duration of waiting based on a buffer capacity of a memory controller.

7. The method of claim 4 further comprising the steps of:
   when second portion of agent data is for a consecutive address to the first portion of agent data,
   concatenating the first portion of the agent data and the second portion of the agent data to form concatenated agent data; and
   writing the concatenated agent data to the first memory device.

8. The method of claim 4 further comprising the steps of:
   when the second portion of the agent data are not for a consecutive address to the first portion of the agent data,
   reading memory data in accordance with the memory burst capability corresponding to the first portion of the agent data;
   replace a first portion of the memory data with the first portion of the agent data; and
   writing the memory data including the first portion of the agent data to the first memory device.

9. The method of claim 8 wherein the step of writing the memory data is performed either as function of time or based on a need to keep some of a buffer empty to allow additional writing of additional agent data by the agent.

10. The method of claim 4 further comprising the step of:
    when a read access to an address corresponding to the first portion of agent data occurs during the step of waiting for the next portion of the agent data,
    providing the first portion of the agent data to the agent from a buffer in a memory controller without accessing the first memory device to obtain the first portion of the agent data.

11. The method of claim 1 further comprising the steps of:
    when the memory burst capability is less than the memory access size and when the memory access is a read access,
    reading a first portion of memory data from the first memory device; and creating a dummy cycle to read a next portion of the memory data from the first memory device.

12. The method of claim 11 further comprising the steps of:
waiting until the first portion of the memory data and the next portion of the memory data are received by a memory controller from the first memory device; and
sending the first portion of the memory data together with the next portion of the memory data to the agent.

13. The method of claim 11 further comprising the step of:
sending the first portion of the memory data to the agent; and
separately sending the next portion of the memory data to the agent.

14. The method of claim 1 further comprising the steps of:
when the memory burst capability is less than the memory access size and when the memory access is write access,
writing a first portion of agent data to the first memory device;
holding a next portion of the agent data in a buffer of a memory controller; and
using dummy cycle to write the next portion of the agent data to the first memory device.

15. The method of claim 1 further comprising the steps of:
when the memory burst capability and the memory access size are compatible and when the memory access is a read access,
reading data from the first memory device; and
providing the data to the agent.

16. The method of claim 1 further comprising the step of:
when the memory burst capability and the memory access size are compatible and when the memory access is write access,
writing data from the agent to the first memory device.

17. The method of claim 1 wherein the agent is selected from a group consisting of:
a central processing unit (CPU);
an accelerated graphics port (AGP) graphics master device;
a PCI interface master device; and
an ISA interface master device.

18. The method of claim 1 wherein the memory burst capability is one of synchronous dynamic random access memory (SDRAM) and double data rate (DDR) memory.

19. The method of claim 1 further comprising the steps of:
determining a second memory burst capability of a second memory device;
determining whether the second memory burst capability and the memory access size are compatible;
when the second memory burst capability and the memory access size are not compatible, effectively adjusting within a memory controller the second memory burst capability to be compatible with the memory access size.

20. The method of claim 19 wherein the memory burst capability and the second memory burst capability are different.

21. The method of claim 19 wherein the first memory device is synchronous dynamic random access memory (SDRAM) and the second memory device is double data rate (DDR) memory.

22. The method of claim 1 further comprising an initialization process comprising the steps of:
reading the memory burst capability; and
programming a memory controller according to the memory burst capability.

23. The method of claim 22 wherein the step of programming the memory controller further comprises the step of:
programming the memory controller according to the memory access size.

24. The method of claim 22 wherein the step of reading the memory burst capability further comprises the step of:
reading other memory attributes.

25. The method of claim 22 further comprising the step of:
configuring the first memory device according to a central processing unit (CPU) type.

26. The method of claim 1 further comprising the steps of:
determining a second memory access size for a second agent;
determining whether the memory burst capability and the second memory access size are compatible;
when the memory burst capability and the second memory access size are not compatible, effectively adjusting within the memory controller the memory burst capability to be compatible with the second memory access size.

27. Apparatus comprising:
a memory accessing agent having a memory access size;
a first memory device having a first memory burst capability; and
a memory controller, the memory controller operatively coupled to the memory accessing agent and to the first memory device, the memory controller effectively adjusting the first memory burst capability to be compatible with the memory access size.

28. The apparatus of claim 27 wherein the first memory device is a synchronous dynamic random access memory (SDRAM) device.

29. The apparatus of claim 27 wherein the first memory device is a double data rate (DDR) memory device.

30. The apparatus of claim 27 further comprising a second memory device having a second memory burst capability, the first burst capability being different from the second memory burst capability.

31. The apparatus of claim 30 wherein the first memory device is a synchronous dynamic random access memory (SDRAM) device and the second memory device is a double data rate (DDR) memory device.

32. Apparatus comprising:
a central processing unit (CPU);
an accelerated graphics port (AGP) graphics master device;
a PCI interface master device;
a memory device;
a system clock generator; the system clock generator operatively coupled to the CPU and providing a system clock signal to the CPU; and
a memory controller, the memory controller operatively coupled to the CPU, the AGP graphics master device, the PCI interface master device, the memory device, and the system clock generator, the memory controller effectively adapting a memory burst capability of the memory device to a memory access size of the CPU, the AGP graphics master device, or the PCI interface master device.

33. The apparatus of claim 32 wherein the memory burst capability is larger than the memory access size.

34. The apparatus of claim 32 wherein the memory burst capability is smaller than the memory access size.

* * * * *